United States Patent
Cheng et al.

(10) Patent No.: US 12,523,792 B2
(45) Date of Patent: Jan. 13, 2026

(54) DETECTION DEVICE FOR HIGH-FREQUENCY PSEUDO-RANDOM (PN) SPREAD SPECTRUM (SS) CODED SEQUENCE SIGNAL OF SHALLOW GEOLOGIC BODY AND METHOD USING THE SAME

(71) Applicant: HUNAN UNIVERSITY OF SCIENCE AND TECHNOLOGY, Xiangtan (CN)

(72) Inventors: Hui Cheng, Xiangtan (CN); Chenxing Jia, Xiangtan (CN); Diquan Li, Xiangtan (CN); Guohong Fu, Xiangtan (CN); Xiuying Liao, Xiangtan (CN)

(73) Assignee: HUNAN UNIVERSITY OF SCIENCE AND TECHNOLOGY, Xiangtan (CN)

( * ) Notice: Subject to any disclaimer, the term of this patent is extended or adjusted under 35 U.S.C. 154(b) by 197 days.

(21) Appl. No.: 18/520,524

(22) Filed: Nov. 27, 2023

(65) Prior Publication Data

US 2024/0103194 A1    Mar. 28, 2024

(30) Foreign Application Priority Data

May 15, 2023 (CN) .......................... 202310538835.1

(51) Int. Cl.
*G01V 3/02* (2006.01)
*H03K 19/177* (2020.01)
*H03K 19/21* (2006.01)

(52) U.S. Cl.
CPC ............. *G01V 3/02* (2013.01); *H03K 19/177* (2013.01); *H03K 19/21* (2013.01)

(58) Field of Classification Search
CPC ......... G01V 3/02; H03K 19/21; H03K 19/177
See application file for complete search history.

(56) References Cited

FOREIGN PATENT DOCUMENTS

| CN | 101833110 A | * | 9/2010 |
| CN | 202330736 U | | 7/2012 |
| CN | 102721982 A | | 10/2012 |

* cited by examiner

*Primary Examiner* — Minh Q Phan

(57) ABSTRACT

A detection device for high-frequency pseudo-random spread spectrum coded sequence signal of shallow geologic body includes a signal transmitter and a synchronous signal receiver. The signal transmitter includes a first Mono-Chip Computer (MCU), a first Field Programmable Gate Array (FPGA), a power amplifier module, a direct-current (DC) power supply, a first display module, a first Global Position System (GPS) synchronization module, a first communication module, and a first memory module. The synchronous signal receiver includes a preamplifier circuit, a bandpass filter circuit, a program-controlled amplifier circuit, an analog to digital (AD) converter circuit, a second FPGA, a second MCU, a second communication module, a second display module, a second GPS synchronization module, and a second memory module. A method using the detection device is further provided.

5 Claims, 13 Drawing Sheets

DETECTION DEVICE FOR HIGH-FREQUENCY PSEUDO-RANDOM (PN) SPREAD SPECTRUM (SS) CODED SEQUENCE SIGNAL OF SHALLOW GEOLOGIC BODY AND METHOD USING THE SAME

CROSS-REFERENCE TO RELATED APPLICATIONS

This application claims the benefit of priority from Chinese Patent Application No. 202310538835.1, filed on May 15, 2023. The content of the aforementioned application, including any intervening amendments thereto, is incorporated herein by reference in its entirety.

TECHNICAL FIELD

This application relates to solid earth geophysics, and more particularly to a detection device for high-frequency pseudo-random (PN) spread spectrum (SS) coded sequence signal of shallow geologic body and method using the same.

BACKGROUND

Shallow underground geological body detection generally refers to detection in the depth range of 2 m-100 m. The detection method can use two major types of electrical method/electromagnetic method and seismic method. The electrical method/electromagnetic method can be subdivided into high-density resistivity method, resistivity method, resistivity sounding method, frequency domain electromagnetic method, time domain electromagnetic method, and ground-penetrating radar. The seismic method can be subdivided into surface wave method and shallow seismic method.

The above methods can be all used to detect shallow underground geological body but vary in the detection accuracy and detection efficiency. The detection accuracy and depth of the high-density resistivity method depend on the geometrical parameters of the observation program. Due to the use of many ground electrodes, it is difficult to ensure the detection efficiency and detection accuracy in areas with poor power connections. The efficiency and accuracy of the resistivity method and the resistivity sounding method are lower. Specifically, like the high-density resistivity method, the reliability of the observation results is poor in areas with poor power connections. The observation depth and the accuracy of longitudinal observation in the frequency domain electromagnetic method are determined by the frequency table set in the observation. Generally, the shallow underground geological body is detected using the audio magnetotelluric sounding devices. However, most of the sounding devices have a maximum frequency of 10 KHz. The shallow underground geological bodies in most areas are in the blind zone of such instruments. For the EH4 conductivity imaging system in the audio magnetotelluric sounding devices, the mid-frequency band and the high-frequency band can be supplemented by the artificial field source. The maximum frequency can be up to 63K, but the frequency is still low, and there still exists the corresponding blind zone. Since the signal emitted by ground-penetrating radar is high-frequency electromagnetic wave, the penetration ability of the electromagnetic wave will be greatly reduced by the influence of good conductors in the geologic body (such as water and clay soil) and far from the required depth of 2 m-100 m. In the time-domain electromagnetic method (transient electromagnetic method), except the GDP-32 and its subsequent multifunctional electrical and electromagnetic exploration instruments with the NanoTem mode, other instruments fail to fulfill the time windows of 1.2 µs and 1.6 µs for high-speed shutdown and high-speed sampling. Meanwhile, after selecting the NanoTem mode, the observation process refers to collection of the early signal of the transient electromagnetic field. In the range of 2 m-100 m, it is necessary to observe the conventional Tem mode and the NanoTem separately and splice the respective observation depths. The shallow underground geological body detection by the transient electromagnetic method includes data fusion of the two modes in addition to the observation efficiency.

SUMMARY

A first object of the present application is to provide a detection device for high-frequency pseudo-random spread spectrum coded signal of shallow geologic body at a depth of 2 m-100 m, which outputs a new pseudo-random spread spectrum coded sequence signal with a certain voltage in the 1 KHz-300 KHz band to the ground. The signal source is output to the earth through a ground electrode A and a ground electrode B to form a circuit, so as to establish a signal field source for exploration. A transmitter records in real time the voltage and current values at the output time, and a receiver acquires and stores the signals synchronously.

Technical solutions are as follows.

In a first aspect, this application provides a detection device for high-frequency pseudo-random (PN) spread spectrum (SS) coded sequence signal of shallow geologic body, comprising:

a signal transmitter; and a synchronous signal receiver;

wherein the signal transmitter comprises a first Mono-Chip Computer (MCU), a first Field Programmable Gate Array (FPGA), a power amplifier module, a direct-current (DC) power supply, a first display module, a first Global Position System (GPS) synchronization module, a first communication module, and a first memory module;

the first MCU is connected to the first display module, the first communication module, the first GPS synchronization module, the first FPGA, and the power amplifier module; the DC power supply is connected to the power amplifier module; and the power amplifier module is connected to the first FPGA;

the first FPGA is configured for collecting in real time output voltage information and output current information and storing the output voltage information and output current information in the first memory module connected to the first FPGA; and the power amplifier module is configured for outputting a pseudo-random combined rectangular wave signal to ground through a first ground electrode and a second ground electrode to form a transmitter circuit;

the synchronous signal receiver comprises a preamplifier circuit, a bandpass filter circuit, a program-controlled amplifier circuit, an analog to digital (AD) converter circuit, a second Field Programmable Gate Array (FPGA), a second Mono-Chip Computer (MCU), a second communication module, a second display module, a second GPS synchronization module, and a second memory module;

the second MCU is connected to the second communication module, the second display module, the second GPS synchronization module, and the second FPGA, and the program-controlled amplifier circuit; and the second FPGA is further connected to the second memory module;

a first receiving electrode and a second receiving electrode are configured to acquire a frequency response signal of geoelectricity; the first receiving electrode and the second receiving electrode are connected to the preamplifier circuit; the frequency response signal passes through the bandpass filter circuit, the program-controlled amplifier circuit, the AD converter circuit and is performed with a high-speed process, so as to obtain a processed frequency response signal; and the second FPGA is configured to store the processed frequency response signal;

the signal transmitter is configured to generate a pseudo-random combined rectangular wave signal in a frequency range of 1 KHz to 300 KHz based on a spread spectrum coded frequency division band; the pseudo-random combined rectangular wave signal is performed with power amplification to be supplied to ground through the first ground electrode and the second ground electrode to form a transmitter circuit; the first FPGA is configured to record in real time voltage information, current information, and time information of an output coded signal; and the synchronous signal receiver is configured to arrange the first receiving electrode and the second receiving electrode on a parallel line of a straight line formed by the first ground electrode and the second ground electrode; the distance between the parallel line and the straight line is R; the frequency response signal acquired by the first receiving electrode and the second receiving electrode are captured and stored by the synchronous signal receiver and processed by a computer, so as to form geoelectric structure information.

In an embodiment, an exclusive-or (XOR) operation is carried out on the first FPGA to generate a first-way unipolar signal and a second-way unipolar signal polarities of which are opposite; the first-way unipolar signal and the second-way unipolar signal access the power amplifier module by a network label T12p and a network label T12n and pass through an operational amplifier U5 and an operational amplifier U6, so as to form the high-frequency pseudo-random spread spectrum coded sequence signal in a C point; the DC power supply accesses to an operational amplifier U7, Q1, and Q2 to amplify the high-frequency pseudo-random spread spectrum coded sequence signal in the C point; and an amplified high-frequency pseudo-random spread spectrum coded sequence signal is output to ground through an interface H1;

the first-way unipolar signal is introduced through the network label T12p and connected to a first terminal of R20; a second terminal of R20 is connected to a first terminal of C42 and a first terminal of R21; a second terminal of C42 is grounded; a second terminal of R21 is connected to an inverting terminal of the operational amplifier U5, a first terminal of R13, a first terminal of C31, wherein the inverting terminal of the operational amplifier U5 is a pin 2 of the operational amplifier U5; and a second terminal of R13 and a second terminal of C31 are connected to an output terminal of the operational amplifier U5, wherein the output terminal of the operational amplifier U5 is a pin 6 of the operational amplifier U5;

the second-way unipolar signal is introduced through the network label T12n and connected to a first terminal of R28; a second terminal of R28 is connected to a first terminal of C49 and a first terminal of R29; a second terminal of C49 is connected to a first terminal of R30 and grounded; a second terminal of R29 is connected to a second terminal of R30 and a non-inverting terminal of the operational amplifier U5, wherein the non-inverting terminal of the operational amplifier U5 is a pin 3 of the operational amplifier U5; a pin 7 of the operational amplifier U5 is connected to VCC+5V; a pin 4 of the operational amplifier U5 is connected to VEE−5V; a first terminal of R22 is connected to the output terminal of the operational amplifier U5; a second terminal of R22 is connected to a non-inverting terminal of an operational amplifier U6, wherein the non-inverting terminal of the operational amplifier U6 is a pin 3 of the operational amplifier U6; an inverting terminal of the operational amplifier U6 is connected to a first terminal of R14 and a first terminal of C32, wherein the inverting terminal of the operational amplifier U6 is a pin 2 of the operational amplifier U6; a second terminal of R14 and a second terminal of C32 are connected to an output terminal of the operational amplifier U6, wherein the output terminal of the operational amplifier U6 is a pin 6 of the operational amplifier U6; a pin 7 of the operational amplifier U6 is connected to VCC+5V; a pin 4 of the operational amplifier U6 is connected to VEE−5V; a first terminal of R23 is connected to the output terminal of the operational amplifier U6; a second terminal of R23 is connected to a first terminal of R25 and connected to a non-inverting terminal of the operational amplifier U7, wherein the non-inverting terminal of the operational amplifier U7 is a pin 3 of the operational amplifier U7; a second terminal of R25 is grounded; an inverting terminal of the operational amplifier U7 is connected to a first terminal of R15, a first terminal of R10, a first terminal of C28, wherein the inverting terminal of the operational amplifier U7 is a pin 2 of the operational amplifier U7; a second terminal of R15 is grounded; a second terminal of R10 and a second terminal of C28 are connected to a pin 1 of an output terminal H1; a pin 7 of the operational amplifier U7 is connected to an external Voltage Collector Collector (VCC) DC power supply which is an external positive DC power supply; a pin 4 of the operational amplifier U7 is connected to an external Voltage Emitter Emitter (VEE) DC power supply which is an external negative DC power supply; an output terminal of the operational amplifier U7 is connected to a first terminal of R19 and a first terminal of R24, wherein the output terminal of the operational amplifier U7 is a pin 6 of the operational amplifier U7; a second terminal of R19 is connected to a base of Q1; a collector of Q1 is connected to the external VCC DC power supply; a second terminal of R24 is connected to a base of Q2; a collector of Q2 is connected to the external VEE DC power supply; an emitter of Q1 and an emitter of Q2 are connected to the pin 1 of the output terminal H1; and a pin 2 of the output terminal H1 is grounded.

In an embodiment, when a lowest frequency is fixed, an inverse repeated m-sequence is spread based on a spreading technique, so as to generate two groups of pseudo-random spreading coded signals with a signal frequency range of 1 KHz to 300 KHz; a code element frequency for a spreading sequence signal is ½ of that of the inverse repeated m-sequence; and a frequency density of the spreading sequence signal is two times of that of the inverse repeated m-sequence.

In an embodiment, a plurality of ultra-audio frequencies are coded to form a single simultaneous generation, transmission and reception of pseudo-random spread spectrum coded sequence signal.

In an embodiment, a detection operation is based on a shallow area within an underground depth of 2-100 m.

In a second aspect, this application provides a method of using the detection device, comprising:

(1) laying the first ground electrode and the second ground electrode according to a detection design requirement; lowering a connecting resistance of the first ground electrode and the second ground electrode by pouring water; connecting a ground electrode connecting wire to the first ground electrode and the second ground electrode; and measuring a first resistance value of the first ground electrode, the second ground electrode, and a connecting circuit;

(2) connecting the DC power supply to an input terminal of the power amplifier module and check a polarity of the DC power supply; and connecting the ground electrode connecting wire to an output terminal of the power amplifier module;

(3) warming the signal transmitter up; checking connection status of the input terminal of the power amplifier module, the output terminal of the power amplifier module, the first ground electrode, the second ground electrode, and the ground electrode connecting wire; and measure a second resistance value of the first ground electrode, the second ground electrode, and the connecting circuit;

(4) after warming the signal transmitter up for 5 minutes, generating and transmitting a high-frequency pseudo-random sequence signal generated based on spread spectrum coding; and adjusting output voltage to detection design voltage to ensure continuous transmission output;

(5) after performing synchronization by the synchronous signal receiver, picking up and checking a geoelectric signal; if the geoelectric signal is ok, start a collecting work;

(6) connecting the synchronous signal receiver to an upper personal computer (PC) through a communication port; and uploading a measurement data to the upper PC for subsequent processing;

(7) uploading output signal voltage data and output signal current data stored in the signal transmitter to the upper PC; and (8) calculating section information of an underground resistivity of a detection area in the upper PC; and making corresponding geological interpretation after map processing.

Compared with the prior art, this application has the following beneficial effects.

This application provides a detection scheme in the field of electromagnetic exploration, which is based on spread spectrum coding to generate high frequency pseudo-random sequence signals with a bandwidth of 1 KHz to 300 KHz and can receive multiple frequencies by a single transmitter. After being amplified through the power output module of the transmitter, the waveform signal forms a high-voltage stable signal source through the ground electrode A and the ground electrode B. The receiver and the transmitter are synchronized to collect and store data in the receiving area parallel to the straight line formed by the two points of the ground electrode A and B. The receiver data is mapped and analyzed by the computer to solve the current problem that it is unable to effectively complete the effective detection of 2 m-100 m depth in the shallow underground geological body detection.

DETAILED DESCRIPTION OF EMBODIMENTS

The present disclosure is further described below in connection with the accompanying drawings and embodiments.

Figure 1:
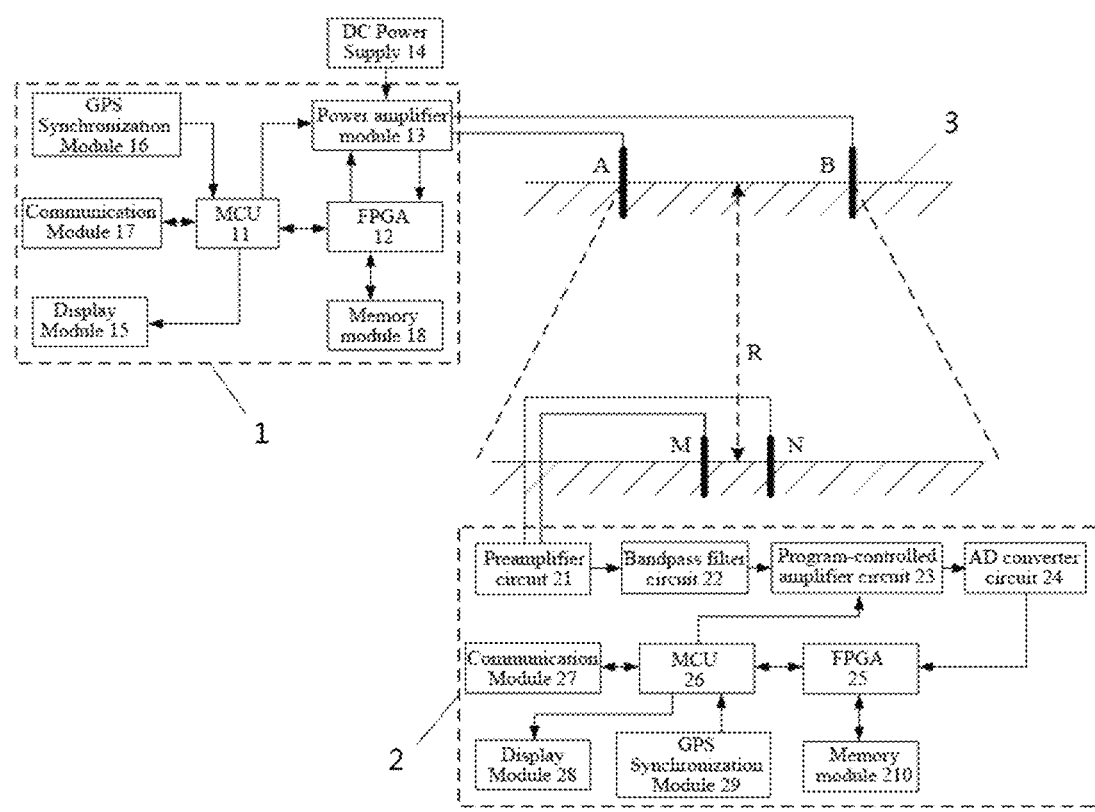
FIG. 1 is a structure diagram of a detection device according to an embodiment of the present disclosure.
Figure 2:
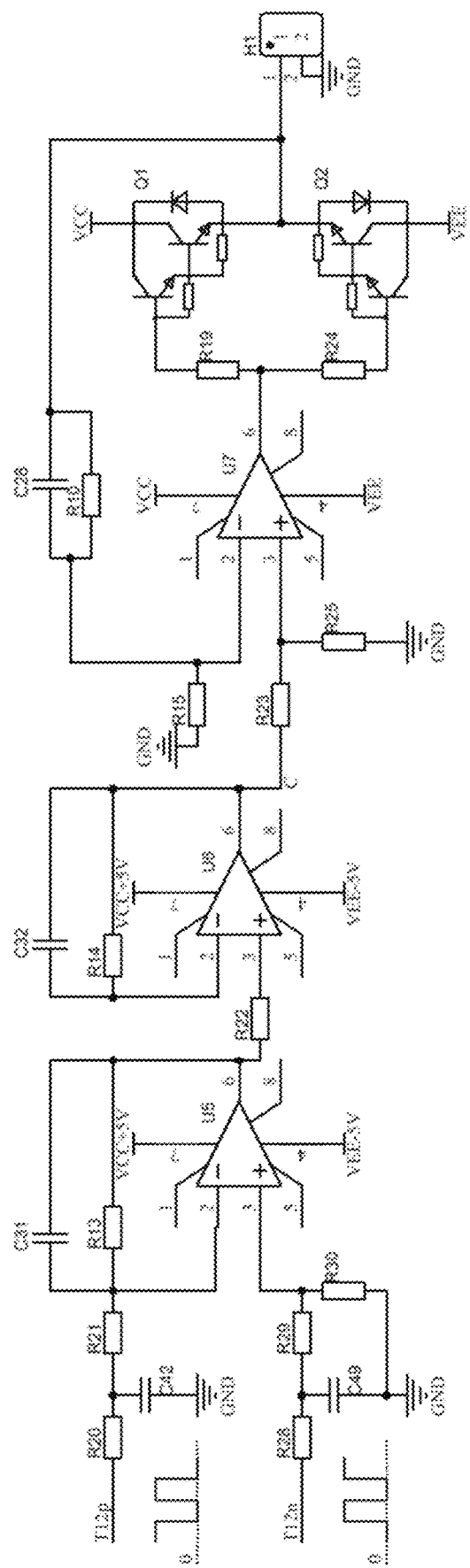
FIG. 2 is a circuit diagram of a power amplifier module according to an embodiment of the present disclosure.

Referring to FIGS. 1 and 2, the detection device for high-frequency pseudo-random (PN) spread spectrum (SS) coded sequence signal of shallow geologic body includes a signal transmitter 1 and a synchronous signal receiver 2. The reference sign 3 denotes the ground.

As shown in FIG. 1, the signal transmitter 1 includes a first Mono-Chip Computer 11 (MCU), a first Field Programmable Gate Array (FPGA) 12, a power amplifier module 13, a direct-current (DC) power supply 14, a first display module 15, a first Global Position System (GPS) synchronization module 16, a first communication module 17, and a first memory module 18.

The first MCU 11 is connected to the first display module 15, the first communication module 17, the first GPS synchronization module 16, the first FPGA 12, and the power amplifier module 13. The DC power supply 14 is connected to the power amplifier module 13. The power amplifier module 13 is connected to the first FPGA 12.

The first FPGA 12 collects in real time output voltage information and output current information and stores the output voltage information and output current information in the first memory module 18 connected to the first FPGA 12. The power amplifier module 13 outputs the signal to ground through a first ground electrode M and a second ground electrode N to form a circuit.

The synchronous signal receiver 2 includes a preamplifier circuit 21, a bandpass filter circuit 22, a program-controlled amplifier circuit 23, an analog to digital (AD) converter circuit 24, a second FPGA 25, a second MCU 26, a second GPS communication module 27, a second display module 28, a second synchronization module 29, and a second memory module 210. The preamplifier circuit 21, the bandpass filter circuit 22, the program-controlled amplifier circuit 23, the AD converter circuit 24, and the second FPGA 25 are sequentially connected. The second MCU 26 is connected to the second communication module 27, the second display module 28, the second GPS synchronization module 29, and the second FPGA 25, and the program-controlled amplifier circuit 23. The second FPGA 25 is further connected to the second memory module 210.

The frequency response signal of the geoelectricity is acquired by the receiving electrode M and the receiving electrode N. The receiving electrode M and the receiving electrode N are connected to the preamplifier circuit 21. The frequency response signal passes through the bandpass filter circuit 22, the program-controlled amplifier circuit 23, the AD converter circuit 24 and is performed with a high-speed process, so as to obtain a processed frequency response signal. The second FPGA 25 is configured to store the processed frequency response signal.

In this embodiment, the chip models used in the signal transmitter are as follows. The FPGA uses EP4CE10E22C8N chip. The MCU uses STM32F103RCT6. The operational amplifiers U5 and U6 in the power amplifier module 13 uses MAX107. U7 operational amplifier uses LM7171BIM. The model of Darlington transistor Q1 is BD677. The model of Darlington transistor Q2 is BD678. The AD converter used for collecting output current and voltage is LTC2325CUKG-16.

In this embodiment, the chip models used in the signal receiver are as follows. The FPGA uses EP4CE10E22C8N chip. The MCU uses STM32F103RCT6. The AD converter is LTC2325CUKG-16. The operational amplifier uses AD8429.

The signal transmitter 1 generates a pseudo-random combined rectangular wave signal in a frequency range of 1 khz to 300 khz based on a spread spectrum coded frequency division band. The pseudo-random combined rectangular wave signal is performed with power amplification and supplied to ground through the ground electrode A and the ground electrode B to form the transmitter circuit. The signal transmitter 1 records by the first FPGA 12 in real time voltage information, current information, and time information of the output coded signal. The synchronous signal receiver 2 is provided with the receiving electrode M and the receiving electrode N on a parallel line of a straight line formed by the first ground electrode and the second ground electrode. The distance between the parallel line and the straight line is R. The frequency response signal acquired by the receiving electrode M and the receiving electrode N are captured and stored by the synchronous signal receiver 2 and processed by a computer, so as to form geoelectric structure information.

Referring to FIG. 2, in the signal transmitter 1, the circuit of the power amplifier module 13 and its connection relationship with the first FPGA 12 and the DC power supply 14 are as follows.

An exclusive-or (XOR) operation is carried out on the first FPGA 12 to generate a first-way unipolar signal and a second-way unipolar signal polarities of which are opposite. The first-way unipolar signal and the second-way unipolar signal access the power amplifier module 13 by a network label T12p and a network label T12n and pass through an operational amplifier U5 and an operational amplifier U6, so as to form the high-frequency pseudo-random spread spectrum coded sequence signal in the C point. The DC power supply 14 accesses an operational amplifier U7, a Darlington transistor Q1, and a Darlington transistor Q2 to amplify the high-frequency pseudo-random spread spectrum coded sequence signal in the C point. The amplified high-frequency pseudo-random spread spectrum coded sequence signal is output to ground through an interface H1.

The first-way unipolar signal is introduced through the network label T12p and connected to a left terminal of R20. A right terminal of R20 is connected to an upper terminal of C42 and a left terminal of R21. A lower terminal of C42 is grounded. A right terminal of R21 is connected to an inverting terminal of the operational amplifier U5, a left terminal of R13, a left terminal of C31. The inverting terminal of the operational amplifier U5 is the pin 2 of the operational amplifier U5. A right terminal of R13 and a right terminal of C31 are connected to an output terminal of the operational amplifier U5. The output terminal of the operational amplifier U5 is the pin 6 of the operational amplifier U5.

The second-way unipolar signal is introduced through the network label T12n and connected to a left terminal of R28. A right terminal of R28 is connected to an upper terminal of C49 and a left terminal of R29. A lower terminal of C49 is connected to a lower terminal of R30 and grounded. A right terminal of R29 is connected to an upper terminal of R30 and a non-inverting terminal of the operational amplifier U5. The non-inverting terminal of the operational amplifier U5 is the pin 3 of the operational amplifier U5. The pin 7 of the operational amplifier U5 is connected to VCC+5V. The pin 4 of the operational amplifier U5 is connected to VEE−5V A left terminal of R22 is connected to the output terminal of the operational amplifier U5. A right terminal of R22 is connected to a non-inverting terminal of an operational amplifier U6. The non-inverting terminal of the operational amplifier U6 is the pin 3 of the operational amplifier U6. An inverting terminal of the operational amplifier U6 is connected to a left terminal of R14 and a left terminal of C32. The inverting terminal of the operational amplifier U6 is the pin 2 of the operational amplifier U6. A right terminal of R14 and a right terminal of C32 are connected to an output terminal of the operational amplifier U6. The output terminal of the operational amplifier U6 is the pin 6 of the operational amplifier U6. The pin 7 of the operational amplifier U6 is connected to VCC+5V. The pin 4 of the operational amplifier U6 is connected to VEE−5V A left terminal of R23 is connected to the output terminal of the operational amplifier U6. A right terminal of R23 is connected to an upper terminal of R25 and connected to a non-inverting terminal of the operational amplifier U7. The non-inverting terminal of the operational amplifier U7 is the pin 3 of the operational amplifier U7. A lower terminal of R25 is grounded. An inverting terminal of the operational amplifier U7 is connected to a right terminal of R15, a left terminal of R10, a left terminal of C28. The inverting terminal of the operational amplifier U7 is the pin 2 of the operational amplifier U7. A left terminal of R15 is grounded. A right terminal of R10 and a right terminal of C28 are connected to the pin 1 of an output terminal H1. The pin 7 of the operational amplifier U7 is connected to an external Voltage Collector Collector (VCC) DC power supply which is an external positive DC power supply. A pin 4 of the operational amplifier U7 is connected to an external Voltage Emitter Emitter (VEE) DC power supply which is an external negative DC power supply. An output terminal of the operational amplifier U7 is connected to a lower terminal of R19 and an upper terminal of R24. The output terminal of the operational amplifier U7 is the pin 6 of the operational amplifier U7. An upper terminal of R19 is connected to a base of the Darlington transistor Q1. A collector of the Darlington transistor Q1 is connected to the external VCC DC power supply. A lower terminal of R24 is connected to a base of the Darlington transistor Q2. A collector of the Darlington transistor Q2 is connected to the external VEE DC power supply. An emitter of the Darlington transistor Q1 and an emitter of the Darlington transistor Q2 are connected to the pin 1 of the output terminal H1. The pin 2 of the output terminal H1 is grounded.

In an embodiment, the signal transmitter 1 generates the pseudo-random sequence coded signal with a lower code element frequency, high frequency point density, and a large bandwidth based on spread spectrum technology, and ultimately generates a signal with a frequency range of 1 KHz to 300 KHz. When the lowest frequency is fixed, the inverse repeated m-sequence is spread based on the spread spectrum, so as to generate two groups of pseudo-random spreading coded signals with the signal frequency range of 1 KHz to 300 KHz. A code element frequency for the spreading sequence signal is ½ of that of the inverse repeated m-sequence. A frequency point density of the spreading sequence signal is two times of that of the inverse repeated m-sequence. A plurality of ultra-audio frequencies are coded to form a single simultaneous generation, transmission and reception of pseudo-random spread spectrum coded sequence signal, which is rapid and efficient and has strong anti-interference ability. The detection depth is mainly for the shallow area within 2-100 m underground depth.

The signal transmitter 1 connects the ground electrode A and the ground electrode B through the connecting wire to form the pseudo-random spread spectrum coded sequence signals outputted as a constant voltage source, thereby forming a stable exploration signal field source. The signal transmitter 1 records in real time the voltage, current value of the field source. The synchronous signal receiver 2 is mainly in synchronization with the signal transmitter 1 to realize high-speed, continuous collection of the corresponding frequency response signals. The PC mainly carries out the corresponding processing, calculation, and mapping work.

The method using the detection device in this disclosure includes the following steps.

(1) The ground electrode A and the ground electrode B are laid according to a detection design requirement. The connecting resistance of the ground electrode A and the ground electrode B is lowered by pouring water. The ground electrode connecting wire relates to the ground electrode A and the ground electrode B. The resistance value of the ground electrode A, the ground electrode B, and a connecting circuit is measured.

(2) The DC power supply 14 is connected to an input terminal of the power amplifier module 13. The polarity of the DC power supply 14 is checked. The ground electrode connecting wire is connected to an output terminal of the power amplifier module 13.

(3) The signal transmitter 1 is turned on to warm up. The connection status of the input terminal of the power amplifier module 13, the output terminal of the power amplifier module 13, the ground electrode A, the ground electrode B, and the ground electrode connecting wire is checked. The resistance value of the ground electrode A, the ground electrode B, and the connecting circuit is measured again.

(4) After warming the signal transmitter 1 up for 5 minutes, the high-frequency pseudo-random sequence signal generated based on spread spectrum coding is generated and transmitted. The output voltage is adjusted to the set detection voltage to ensure continuous transmission output.

(5) After synchronizing the synchronous signal receiver 2, the geoelectric signal is picked up and checked by the field observation technicians. If the geoelectric signal is ok, start the collecting work.

(6) The synchronous signal receiver 2 is connected to the upper personal computer (PC) through a communication port. The measurement data is uploaded to the upper PC for subsequent processing.

(7) The output signal voltage data and the output signal current data stored in the signal transmitter 1 are uploaded to the upper PC.

(8) The section information of an underground resistivity of a detection area is calculated in the upper PC. The corresponding geological interpretation is made after map processing.

Based on the need to detect the shallow geologic body within 2-100 m, the present disclosure proposes a high-frequency electromagnetic signal transmitter that uses pseudo-random spread spectrum coded sequence signals as the exploration field source. The pseudo-random spread spectrum coded sequence signals are introduced into the ground through the ground electrodes A and B to form a stable exploration signal field source. The receiving electrodes M, N pick up the geoelectric field response signals. The geoelectric field response signals are pre-amplified by the signal receiver, performed with band-pass filtering, program-controlled amplification, and analog-to-digital conversion, then performed with high-speed processing by the FPGA, and the time series signals are stored. The received time series signals are processed, calculated, and plotted by the PC at a later stage to form the electromagnetic bathymetric curve in the frequency domain at the observation points.

In general, for 2-100 m shallow geologic body exploration work, if the frequency domain electromagnetic bathymetry is used for exploration, the signal field source should have the following requirements: (1) the highest frequency should be high enough, and the skin depth corresponding to the low frequency should be greater than the target layer depth; (2) the frequency range should be a certain width, the frequency points within the frequency band are enough, and the density of the frequency points is large enough; (3) the field exploration work has strong interference capability, and the pseudo-random coded signals to be emitted need to have a certain current strength.

Figure 3:
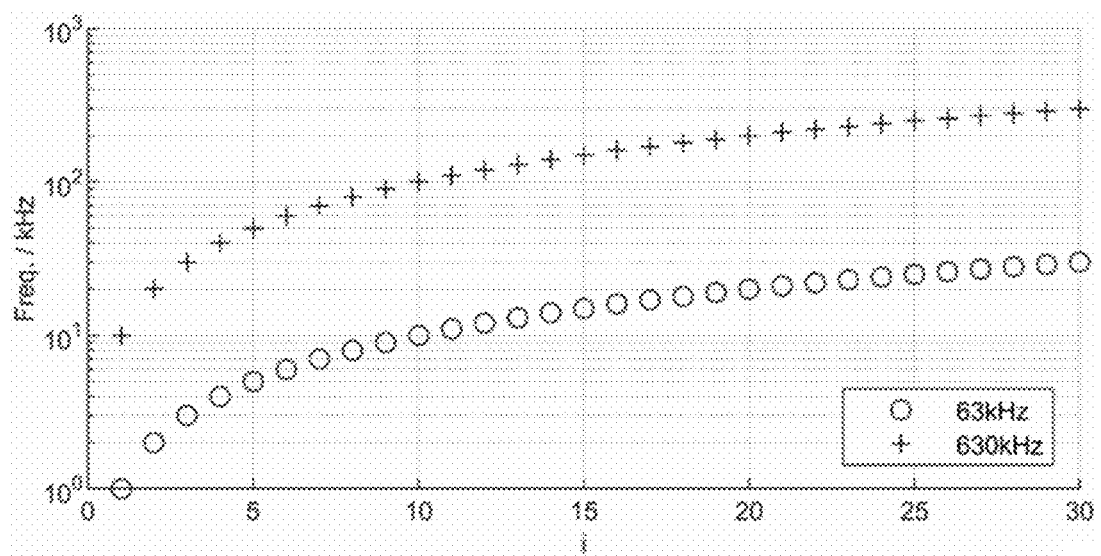
FIG. 3 is a frequency distribution diagram of pseudo-random spread spectrum coded signal according to an embodiment of the present disclosure.

For the above three problems, the present disclosure adopted a pseudo-random inverse repetitive m-sequence signal-based direct frequency spreading program. The frequency band range was within 1 kHz-300 kHz, and there were 39 frequency points in total. When the surface electrical resistivity of the observed target area was 100 Ωgm, for example, the skin depth could reach 159 m at the low-frequency point of 1 kHz; and for example, the skin depth was 9 m at the high-frequency point of 300 kHz. FIG. 3 showed the distribution diagram of the frequency points of the sequence signals, in which the horizontal axis was the number of frequency points, and the vertical axis was the frequency in kHz. Table 1 was the skin depth calculation table when the surface electrical resistivity was 100 Ωgm. As shown in FIG. 3, when the code element frequency was 63 kHz, the contained frequency was low frequency band, covering 1 kHZ to 16 kHz; when the code element frequency was 630K, the contained frequency was high frequency band, covering 10 kHz-300 kHz.

TABLE 1

Correspondence between frequency and skin depth
Surface electrical resistivity of 100 Ω gm

| Frequency $f_k/kHz$ | Skin depth $_{\delta/m}$ |
|---|---|
| 1 | 159.06 |
| 2 | 112.47 |
| 3 | 91.83 |
| 4 | 79.53 |
| 5 | 71.13 |
| 6 | 64.94 |
| 7 | 60.12 |
| 8 | 56.24 |
| 9 | 53.02 |
| 10 | 50.3 |
| 20 | 35.57 |
| 30 | 29.04 |
| 40 | 25.15 |
| 50 | 22.49 |
| 60 | 20.53 |
| 70 | 19.01 |
| 80 | 17.78 |
| 90 | 16.77 |
| 100 | 15.91 |
| 110 | 15.17 |
| 120 | 14.52 |
| 130 | 13.95 |
| 140 | 13.44 |
| 150 | 12.99 |
| 160 | 12.58 |
| 170 | 12.20 |
| 180 | 11.86 |
| 190 | 11.54 |
| 200 | 11.25 |
| 210 | 10.98 |
| 220 | 10.72 |
| 230 | 10.49 |
| 240 | 10.27 |
| 250 | 10.06 |
| 260 | 9.86 |
| 270 | 9.68 |
| 280 | 9.51 |
| 290 | 9.34 |
| 300 | 9.18 |

The verification experiments of the embodiments of the present disclosure were as follows.

Referring to FIGS. 4 to 13, the five-order expression showed the observed transmit waveforms and spectra thereof, the received waveforms and spectra thereof, the received data quality check, the actual observed data processing flow, and the two-dimensional geoelectric cross-section results during the experimental work of the embodiment with a total of 16 frequency points in the range of 10K-160K.

This embodiment showed a tailing sand thickness detection validation experiment. The tailing sand thickness was controlled by the design floor elevation as well as the current tailing sand elevation in the tailing sand reservoir. The distance between observation points was 3 m, and the distance between the receiving electrodes M and N was 6 m. Based on the field resistivity measurement results and known information, the frequency band range during the experiment was set to the interval of 10 k-160 kHz, and the observation effect validation experiment was carried out. After preparing the field validation experiment, the observed five-order pseudo-random spread spectrum coded sequence signal was generated and downloaded to the transmitter. In the five-order pseudo-random spread spectrum coded sequence signal, the code element frequency of this validation experiment was $f_c$=310K.

Figure 4:
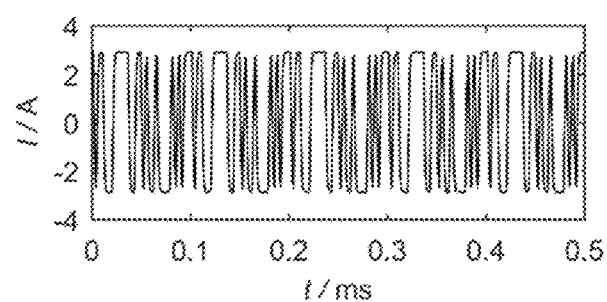
FIG. 4 is a waveform segment diagram of an emission current according to an embodiment of the present disclosure.
Figure 5:
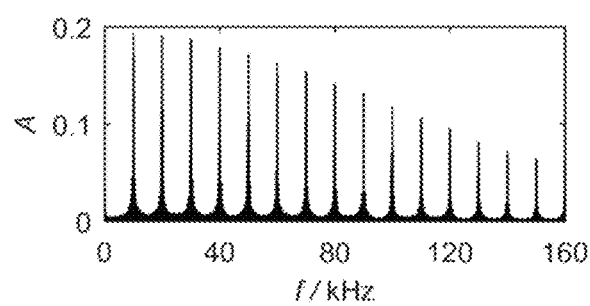
FIG. 5 is a frequency spectrogram of the emission current according to an embodiment of the present disclosure.

In FIGS. 4 and 5, the time waveforms (segments) as well as the complete spectrum at the code element frequency $f_c$=310K could be seen. The reason for using the time waveform segments was that the number of jumps with time was too high to see the characteristics of the complete transmit signals, and only fragments of the transmit and receive waveform signals were presented here.

Figure 6:
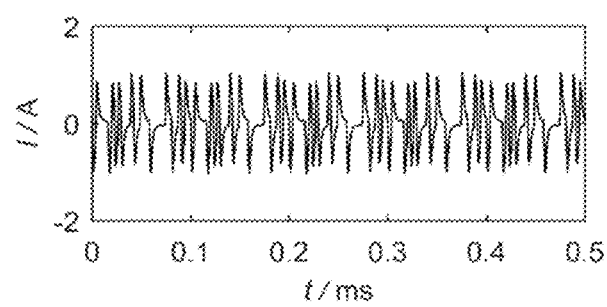
FIG. 6 is a voltage waveform segment diagram (fifth order fc=310 KHz) of a receiving end according to an embodiment of the present disclosure.
Figure 7:
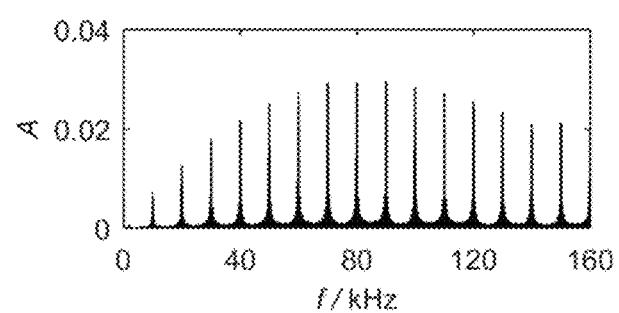
FIG. 7 is a voltage waveform frequency spectrogram (fifth order fc=310 KHz) of the receiving end according to an embodiment of the present disclosure.

From the time waveforms (segments) received by the receiver in FIGS. 6 and 7, the waveform characteristics had been significantly distorted due to the nonlinear response of the electrical response of the ground, but the same frequency of the transmit signals could still be extracted from the observed time waveform.

Figure 8:
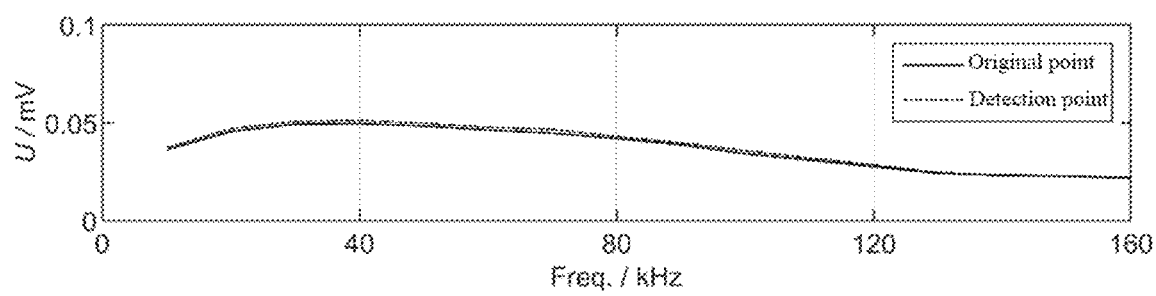
FIG. 8 is a quality check diagram of received data according to an embodiment of the present disclosure.

In FIG. 8, the observation results of the same point, different receivers and different time periods were shown, and it could be seen that the consistency of the channel in this embodiment was high, and the root-mean-square error of the two observations was 0.12%, which indicated that the data in this embodiment were credible.

Figure 9:
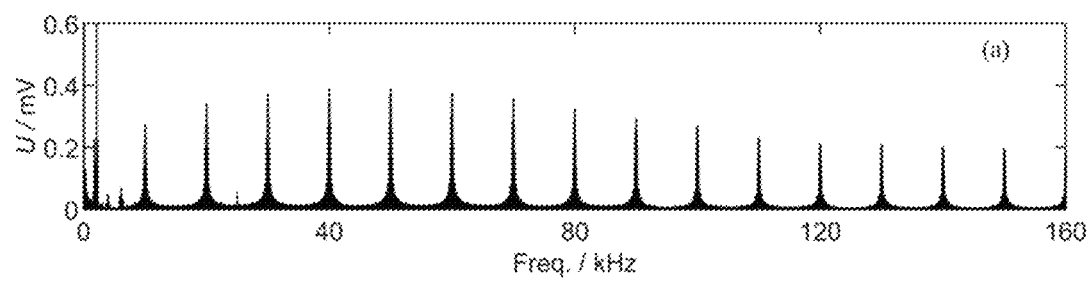
FIG. 9 shows a received signal frequency spectrogram at a transceiver distance of 50 m according to an embodiment of the present disclosure.
Figure 10:
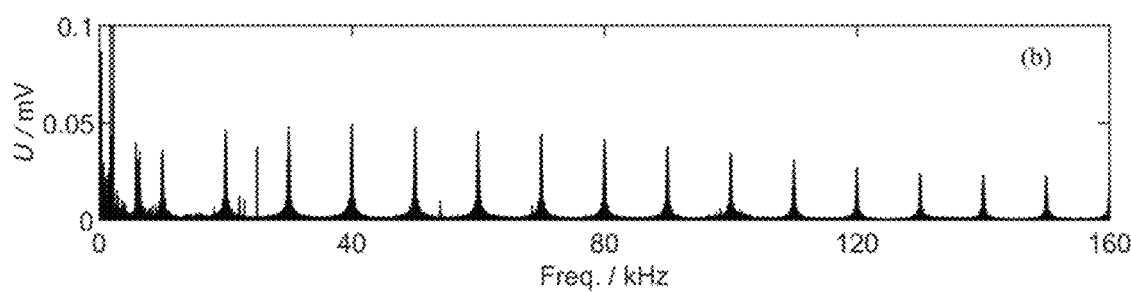
FIG. 10 shows a received signal frequency spectrogram at a transceiver distance of 100 m according to an embodiment of the present disclosure.
Figure 11:
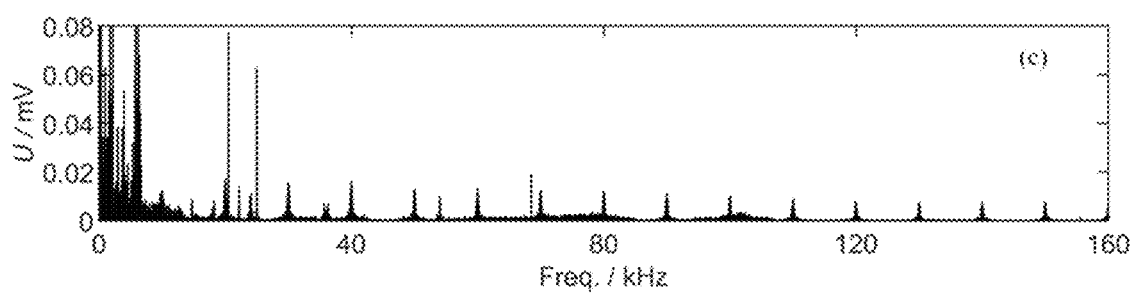
FIG. 11 shows a received signal frequency spectrogram at a transceiver distance of 150 m according to an embodiment of the present disclosure.

FIGS. 9-11 showed the spectrum comparison of the received signals with different R values (transceiver distances).

Figure 12:
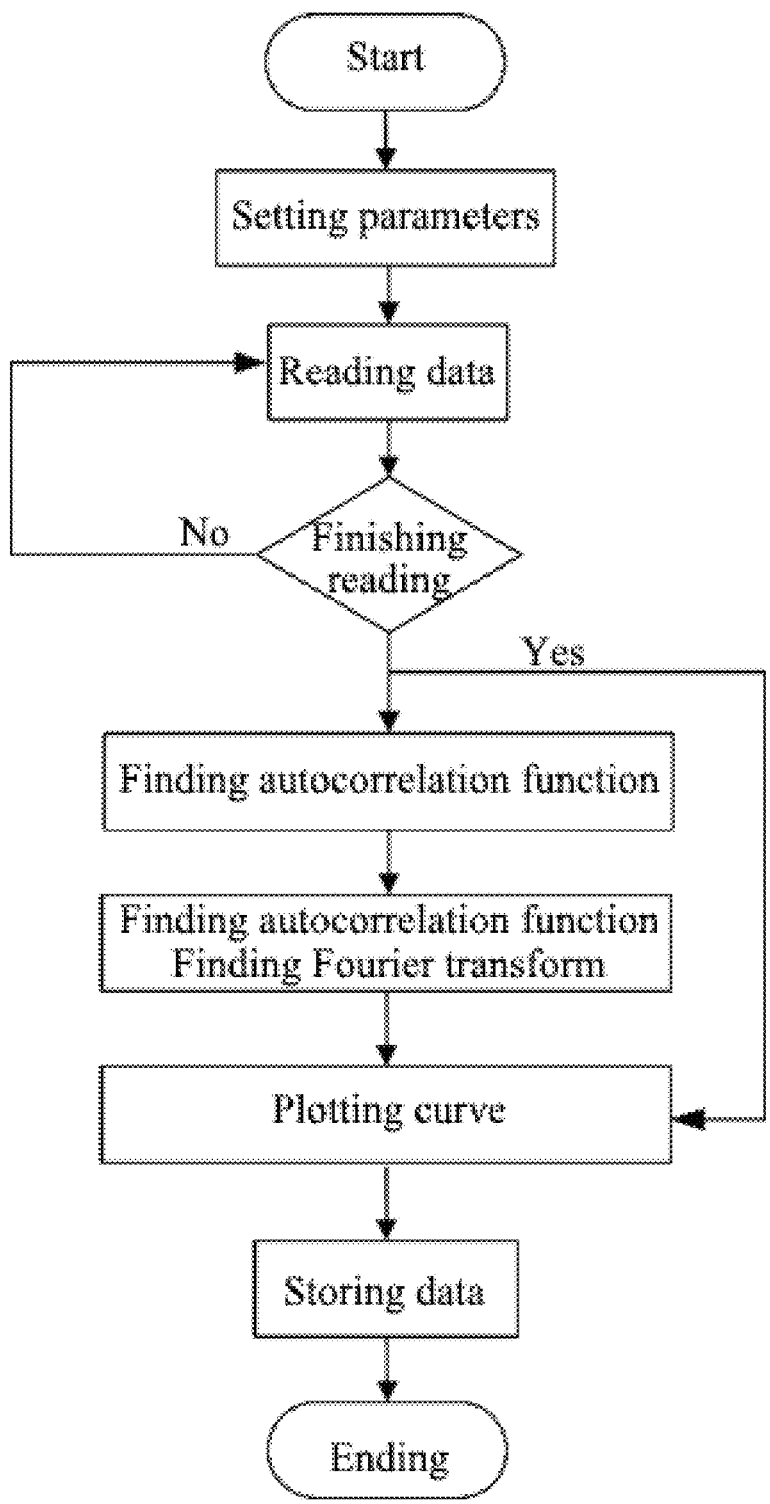
FIG. 12 is a flowchart of observed signal extraction power spectrum according to an embodiment of the present disclosure.

FIG. 12 showed the processing flow chart of actual observation data.

Figure 13:
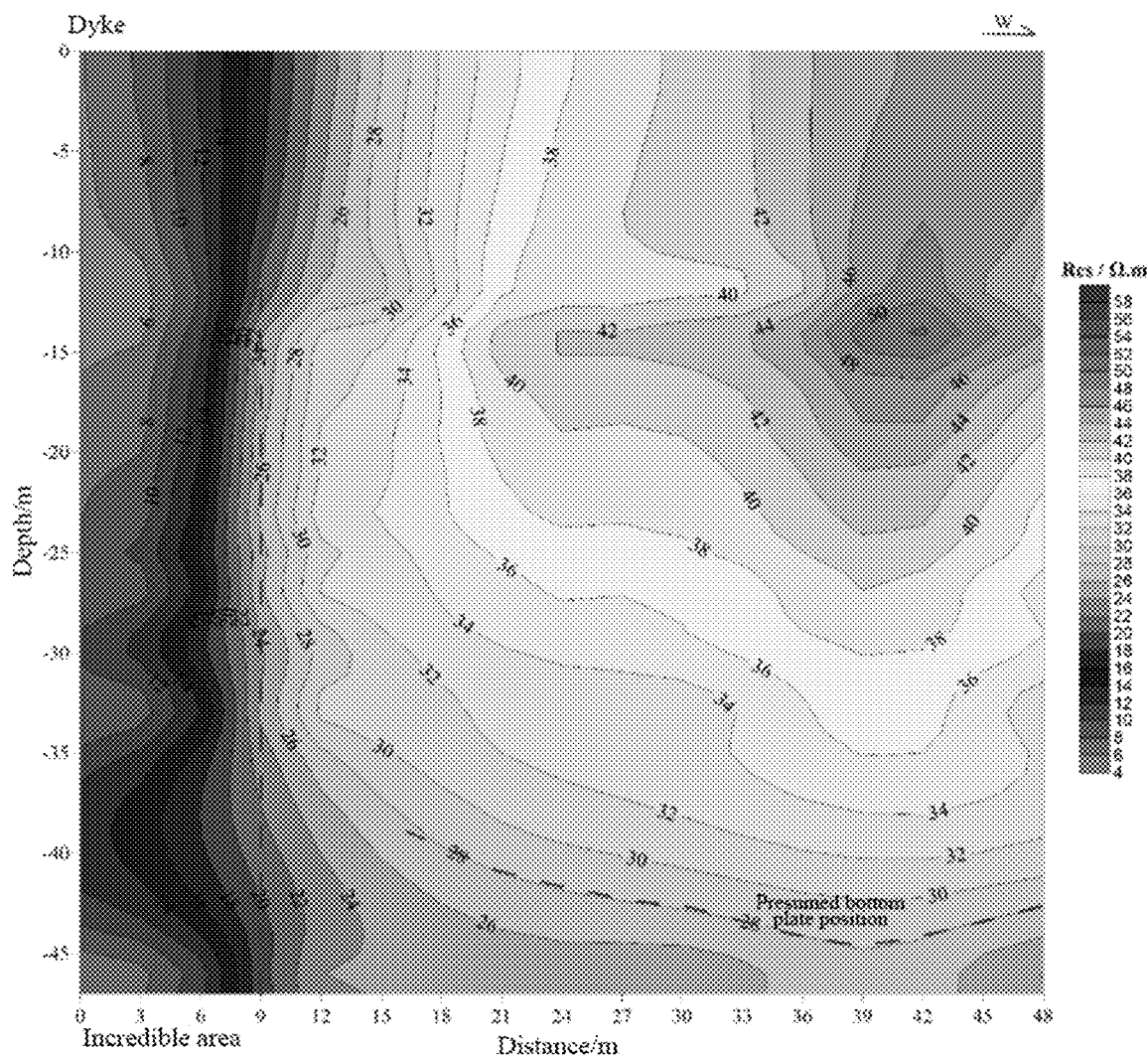
FIG. 13 shows profile results according to an embodiment of the present disclosure.

FIG. 13 showed the actual observation results which were as follows.

(1) The 0-9 m was in the vicinity of the dyke of the reservoir area. The amplitude value of the spectrum after sending and receiving correlation was obviously lower than that of other observation points in the measurement line. The electromagnetic interference of the first three observation points was large, and it was presumed that the observation cables and the lighting cables of the dyke interfered the received measurement signals, resulting in the low credibility of the data in this area.

(2) The 12-48 m area was the dry storage area of the tailing sand bank. The high resistivity area appeared at a depth of 13-15 m, centered at 39-42 m. The electrical resistivity curve in the area was closed, indicating that the underground medium was in the form of a mass and uniform, and the high resistance area was open upward. The resistivity around the high-resistance zone changed from high to low in a stratified manner. Combined with the position of the sand outlet and the electrical resistivity pattern, it was presumed that the high resistance was caused by the accumulation of tailing sand at the sand outlet, which was not completely dewatered and compacted.

(3) In the area of 12-48 m, the electrical resistivity in the depth of −20 m to −40 m was layered, which was presumed to be caused by the obvious resistivity layer due to the compaction and dehydration of the tailing sand discharged in the area.

(4) According to the design data of the tailing sand reservoir: the elevation of the designed bottom plate was 276.33 m, and the elevation of the pile in the tailing sand reservoir area was 317.66 m, with a height difference of about 41 m, which was basically consistent with the thickness of the tailing sand as speculated in the experimental profile observation results.

What is claimed is:

1. A detection device for high-frequency pseudo-random (PN) spread spectrum (SS) coded sequence signal of shallow geologic body, comprising:
    a signal transmitter; and
    a synchronous signal receiver;
    wherein the signal transmitter comprises a first Mono-Chip Computer (MCU), a first Field Programmable Gate Array (FPGA), a power amplifier module, a direct-current (DC) power supply, a first display module, a first Global Position System (GPS) synchronization module, a first communication module, and a first memory module;
    the first MCU is connected to the first display module, the first communication module, the first GPS synchronization module, the first FPGA, and the power amplifier module; the DC power supply is connected to the power amplifier module; and the power amplifier module is connected to the first FPGA;
    the first FPGA is configured for collecting in real time output voltage information and output current information and storing the output voltage information and output current information in the first memory module connected to the first FPGA; and the power amplifier module is configured for outputting a pseudo-random combined rectangular wave signal to ground through a first ground electrode and a second ground electrode to form a transmitter circuit;
    the synchronous signal receiver comprises a preamplifier circuit, a bandpass filter circuit, a program-controlled amplifier circuit, an analog to digital (AD) converter circuit, a second FPGA, a second MCU, a second communication module, a second display module, a second GPS synchronization module, and a second memory module;
    the second MCU is connected to the second communication module, the second display module, the second GPS synchronization module, and the second FPGA, and the program-controlled amplifier circuit; and the second FPGA is further connected to the second memory module;
    a first receiving electrode and a second receiving electrode are configured to acquire a frequency response signal of geoelectricity; the first receiving electrode and the second receiving electrode are connected to the preamplifier circuit; the frequency response signal passes through the bandpass filter circuit, the program-controlled amplifier circuit, the AD converter circuit and is performed with a high-speed process, so as to obtain a processed frequency response signal; and the second FPGA is configured to store the processed frequency response signal;
    the signal transmitter is configured to generate a pseudo-random combined rectangular wave signal in a frequency range of 1 KHz to 300 KHz based on a spread spectrum coded frequency division band; the pseudo-random combined rectangular wave signal is performed with power amplification to be supplied to ground through the first ground electrode and the second ground electrode to form the transmitter circuit; the first FPGA is configured to record in real time voltage information, current information, and time information of an output coded signal; and
    the synchronous signal receiver is configured to arrange the first receiving electrode and the second receiving electrode on a parallel line of a straight line formed by the first ground electrode and the second ground electrode; the frequency response signal acquired by the first receiving electrode and the second receiving electrode is captured and stored by the synchronous signal receiver and processed by a computer, so as to form geoelectric structure information.

2. The detection device of claim 1, wherein when a lowest frequency is fixed, an inverse repeated m-sequence is spread based on a spread spectrum, so as to generate two groups of pseudo-random spreading coded signals with a signal frequency range of 1 KHz to 300 KHz; a code element frequency for a spreading sequence signal is ½ of that of the inverse repeated m-sequence; and a frequency point density of the spreading sequence signal is two times of that of the inverse repeated m-sequence.

3. The detection device of claim 1, wherein a plurality of ultra-audio frequencies are coded to form a single simultaneous generation, transmission and reception of pseudo-random spread spectrum coded sequence signal.

4. The detection device of claim 1, wherein a detection operation is based on a shallow area within an underground depth of 2-100 m.

5. A method using the detection device of claim 1, comprising:
    (1) laying the first ground electrode and the second ground electrode according to a detection design requirement; lowering a connecting resistance of the first ground electrode and the second ground electrode by pouring water; connecting a ground electrode connecting wire to the first ground electrode and the second ground electrode; and measuring a first resistance value of the first ground electrode, the second ground electrode, and a connecting circuit;
    (2) connecting the DC power supply to an input terminal of the power amplifier module; checking a polarity of the DC power supply; and connecting the ground electrode connecting wire to an output terminal of the power amplifier module;
    (3) warming the signal transmitter up; checking connection status of the input terminal of the power amplifier module, the output terminal of the power amplifier module, the first ground electrode, the second ground electrode, and the ground electrode connecting wire; and measure a second resistance value of the first ground electrode, the second ground electrode, and the connecting circuit;
    (4) after warming the signal transmitter up for 5 minutes, generating and transmitting a high-frequency pseudo-random sequence signal generated based on spread spectrum coding; and adjusting output voltage to a set detection voltage to ensure continuous transmission output;
    (5) after synchronizing the synchronous signal receiver, picking up and checking a geoelectric signal; if the geoelectric signal is ok, start a collecting work;
    (6) connecting the synchronous signal receiver to an upper personal computer (PC) through a communication port; and uploading a measurement data to the upper PC for subsequent processing;

(7) uploading output signal voltage data and output signal current data stored in the signal transmitter to the upper PC; and
(8) calculating section information of an underground resistivity of a detection area in the upper PC; and making corresponding geological interpretation after map processing.

\* \* \* \* \*